(12) United States Patent
Yim et al.

(10) Patent No.: US 6,838,393 B2
(45) Date of Patent: Jan. 4, 2005

(54) METHOD FOR PRODUCING SEMICONDUCTOR INCLUDING FORMING A LAYER CONTAINING AT LEAST SILICON CARBIDE AND FORMING A SECOND LAYER CONTAINING AT LEAST SILICON OXYGEN CARBIDE

(75) Inventors: Kang Sub Yim, Mountain View, CA (US); Melissa M. Tam, Fremont, CA (US); Dian Sugiarto, Sunnyvale, CA (US); Chi-I Lang, Sunnyvale, CA (US); Peter Wai-Man Lee, San Jose, CA (US); Li-Qun Xia, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/247,404

(22) Filed: Sep. 19, 2002

(65) Prior Publication Data

US 2003/0139035 A1 Jul. 24, 2003

Related U.S. Application Data

(63) Continuation-in-part of application No. 10/196,498, filed on Jul. 15, 2002.
(60) Provisional application No. 60/397,184, filed on Jul. 19, 2002, and provisional application No. 60/340,615, filed on Dec. 14, 2001.

(51) Int. Cl.$^7$ .................... H01L 21/469; H01L 21/31
(52) U.S. Cl. .................. 438/769; 438/786; 438/788; 438/789
(58) Field of Search ................. 438/769, 786, 438/788, 789

(56) References Cited

U.S. PATENT DOCUMENTS 3,510,369 A    5/1970   Ernick et al. ............... 148/187
4,262,631 A    4/1981   Kubacki ...................... 118/723
4,532,150 A    7/1985   Endo et al. .................. 427/39

(List continued on next page.)

FOREIGN PATENT DOCUMENTS

| DE | 196 54 737 A1 | 12/1996 | .......... H01L/21/31 |
| DE | 199 04 311 A1 | 8/1999 | |
| EP | 0613 178 A2 | 2/1994 | .......... H01L/21/90 |

(List continued on next page.)

OTHER PUBLICATIONS

PCT International Search Report for US/02/36229, dated Sep. 3, 2003 (AMAT/6392.PC).

Fukuda, et al. "Highly Reliable SiOF Film Formation by ECR–CVD Using SiF$_2$H$_2$", Symposium on VLSI Technology Digest of Technical Papers IEEE (1996) pp. 114–115.

PCT/International Search Report for US/02/40034 dated May 19, 2003.

(List continued on next page.)

Primary Examiner—William M. Brewster
(74) Attorney, Agent, or Firm—Moser, Patterson & Sheridan

(57) ABSTRACT

Methods are provided for depositing a silicon carbide layer having significantly reduced current leakage. The silicon carbide layer may be a barrier layer or part of a barrier bilayer that also includes a barrier layer. Methods for depositing oxygen-doped silicon carbide barrier layers are also provided. The silicon carbide layer may be deposited by reacting a gas mixture comprising an organosilicon compound, an aliphatic hydrocarbon comprising a carbon-carbon double bond or a carbon-carbon triple bond, and optionally, helium in a plasma. Alternatively, the silicon carbide layer may be deposited by reacting a gas mixture comprising hydrogen or argon and an organosilicon compound in a plasma.

27 Claims, 2 Drawing Sheets

U.S. PATENT DOCUMENTS

| | | | |
|---|---|---|---|
| 4,634,601 A | 1/1987 | Hamakawa et al. | 427/39 |
| 4,759,947 A | 7/1988 | Ishihara et al. | 427/38 |
| 4,872,947 A | 10/1989 | Wang et al. | 156/643 |
| 4,894,352 A | 1/1990 | Lane et al. | 438/763 |
| 4,895,734 A | 1/1990 | Yoshida et al. | 427/38 |
| 4,951,601 A | 8/1990 | Maydan et al. | 118/719 |
| 5,011,706 A | 4/1991 | Tarhay et al. | 427/39 |
| 5,086,014 A | 2/1992 | Miyata et al. | 437/103 |
| 5,224,441 A | 7/1993 | Felts et al. | 118/718 |
| 5,238,866 A | 8/1993 | Bolz et al. | 437/100 |
| 5,242,530 A * | 9/1993 | Batey et al. | 117/90 |
| 5,298,597 A | 3/1994 | You et al. | 528/336 |
| 5,360,491 A | 11/1994 | Carey et al. | 136/256 |
| 5,465,680 A * | 11/1995 | Loboda | 117/84 |
| 5,468,978 A | 11/1995 | Dowben | 257/258 |
| 5,480,300 A | 1/1996 | Okoshi et al. | 432/241 |
| 5,494,712 A | 2/1996 | Hu et al. | 427/489 |
| 5,554,570 A | 9/1996 | Maeda et al. | 438/763 |
| 5,565,084 A | 10/1996 | Lee et al. | 205/646 |
| 5,591,566 A | 1/1997 | Ogawa | 430/325 |
| 5,607,773 A | 3/1997 | Ahlburn et al. | 428/427 |
| 5,638,251 A | 6/1997 | Goel et al. | 361/313 |
| 5,641,607 A | 6/1997 | Ogawa et al. | 430/272.1 |
| 5,658,834 A | 8/1997 | Dowben | 438/478 |
| 5,691,209 A | 11/1997 | Liberkowski | 437/7 |
| 5,710,067 A | 1/1998 | Foote et al. | 437/238 |
| 5,711,987 A | 1/1998 | Bearinger et al. | 427/7 |
| 5,730,792 A | 3/1998 | Camilletti et al. | 106/287.14 |
| 5,741,626 A | 4/1998 | Jain et al. | 430/314 |
| 5,776,235 A | 7/1998 | Camilletti et al. | 106/287.1 |
| 5,780,163 A | 7/1998 | Camilletti et al. | 428/446 |
| 5,789,316 A | 8/1998 | Lu | 438/637 |
| 5,789,776 A | 8/1998 | Lancaster et al. | 257/296 |
| 5,817,579 A | 10/1998 | Ko et al. | 438/740 |
| 5,818,071 A | 10/1998 | Loboda et al. | 257/77 |
| 5,855,681 A | 1/1999 | Maydan et al. | 118/719 |
| 5,869,396 A | 2/1999 | Pan et al. | 438/647 |
| 5,876,891 A | 3/1999 | Takimoto et al. | 430/71 |
| 5,926,740 A | 7/1999 | Forbes et al. | 438/763 |
| 5,989,998 A | 11/1999 | Sugahara et al. | 438/623 |
| 6,051,321 A | 4/2000 | Lee et al. | 428/447 |
| 6,054,379 A | 4/2000 | Yau et al. | 438/623 |
| 6,060,132 A | 5/2000 | Lee | 427/579 |
| 6,068,884 A | 5/2000 | Rose et al. | 427/255.6 |
| 6,071,809 A | 6/2000 | Zhao | 438/634 |
| 6,072,227 A | 6/2000 | Yau et al. | 257/642 |
| 6,107,192 A | 8/2000 | Subrahmanyan et al. | 438/637 |
| 6,140,226 A | 10/2000 | Grill et al. | 438/637 |
| 6,147,009 A * | 11/2000 | Grill et al. | 438/780 |
| 6,159,871 A | 12/2000 | Loboda et al. | 438/786 |
| 6,242,339 B1 | 6/2001 | Aoi | 438/623 |
| 6,287,990 B1 | 9/2001 | Cheung et al. | 438/780 |
| 6,291,334 B1 | 9/2001 | Somekh | 438/620 |
| 6,303,523 B2 | 10/2001 | Cheung et al. | 438/780 |
| 6,312,793 B1 | 11/2001 | Grill et al. | 428/312.6 |
| 6,316,167 B1 | 11/2001 | Angelopoulos et al. | 430/313 |
| 6,340,435 B1 | 1/2002 | Bjorkman et al. | 216/72 |
| 6,340,628 B1 | 1/2002 | Van Cleemput et al. | 438/586 |
| 6,344,693 B1 | 2/2002 | Kawahara et al. | 257/759 |
| 6,348,725 B2 | 2/2002 | Cheung et al. | 257/642 |
| 6,352,945 B1 | 3/2002 | Matsuki et al. | 257/642 |
| 6,383,955 B1 | 5/2002 | Matsuki et al. | 438/790 |
| 6,410,462 B1 * | 6/2002 | Yang et al. | 438/788 |
| 6,410,463 B1 | 6/2002 | Matsuki | 438/798 |
| 6,413,583 B1 | 7/2002 | Moghadam et al. | 427/249.15 |
| 6,432,846 B1 | 8/2002 | Matsuki | 438/720 |
| 6,436,824 B1 | 8/2002 | Chooi et al. | 438/687 |
| 6,437,443 B1 | 8/2002 | Grill et al. | 257/758 |
| 6,455,445 B2 | 9/2002 | Matsuki et al. | 438/789 |
| 6,465,366 B1 | 10/2002 | Nemani et al. | 438/778 |
| 6,500,773 B1 | 12/2002 | Gaillard et al. | 438/798 |
| 6,511,903 B1 | 1/2003 | Yau et al. | 438/623 |
| 6,511,909 B1 | 1/2003 | Yau et al. | 438/638 |
| 6,532,150 B2 | 3/2003 | Sivertsen et al. | 361/685 |
| 6,537,929 B1 | 3/2003 | Cheung et al. | 438/728 |
| 6,541,282 B1 | 4/2003 | Cheung et al. | 438/5 |
| 6,555,476 B1 | 4/2003 | Olsen et al. | 438/697 |
| 6,562,690 B1 | 5/2003 | Cheung et al. | 438/480 |
| 6,573,196 B1 | 6/2003 | Gaillard et al. | 438/789 |
| 6,592,890 B1 | 7/2003 | Green | 424/447 |
| 6,593,247 B1 | 7/2003 | Huang et al. | 438/758 |
| 6,596,655 B1 | 7/2003 | Cheung et al. | 438/739 |
| 6,624,053 B2 | 9/2003 | Passemard | 438/584 |
| 6,660,656 B2 | 12/2003 | Cheung et al. | 438/761 |
| 6,660,663 B1 | 12/2003 | Cheung et al. | 438/789 |
| 6,730,593 B2 | 5/2004 | Yau et al. | 438/638 |
| 6,734,115 B2 | 5/2004 | Cheung et al. | 438/789 |
| 2002/0000670 A1 | 1/2002 | Yau et al. | 257/759 |
| 2002/0093075 A1 * | 7/2002 | Gates et al. | 257/531 |
| 2002/0111042 A1 | 8/2002 | Yau et al. | 438/78 |
| 2002/0160626 A1 | 10/2002 | Matsuki et al. | 438/730 |
| 2002/0172766 A1 | 11/2002 | Laxman et al. | 427/255.28 |
| 2003/0001282 A1 * | 1/2003 | Meynen et al. | 257/777 |
| 2003/0003765 A1 | 1/2003 | Gibson, Jr. et al. | 438/760 |
| 2003/0042605 A1 | 3/2003 | Andideh et al. | 257/741 |
| 2003/0064154 A1 | 4/2003 | Laxman et al. | 427/299.28 |
| 2003/0068881 A1 | 4/2003 | Xia et al. | 438/637 |
| 2003/0089988 A1 | 5/2003 | Matsuura | 257/758 |
| 2003/0111730 A1 | 6/2003 | Takeda et al. | 257/758 |
| 2003/0129827 A1 | 7/2003 | Lee et al. | 438/629 |
| 2003/0139035 A1 | 7/2003 | Yim et al. | 438/643 |
| 2003/0194496 A1 | 10/2003 | Xu et al. | 427/255.28 |

FOREIGN PATENT DOCUMENTS

| | | | | |
|---|---|---|---|---|
| EP | 0 725 440 A2 | 8/1996 | | H01L/23/532 |
| EP | 1 029 728 A1 | 8/2000 | | |
| EP | 1 107 303 A2 | 6/2001 | | |
| EP | 1 176 226 A1 | 1/2002 | | C23C/16/32 |
| JP | 09-008031 | 1/1997 | | |
| JP | 09-321175 A * | 12/1997 | | H01L/23/12 |
| WO | WO 99/33102 | 7/1999 | | H01L/21/768 |
| WO | WO 99/41423 A2 | 8/1999 | | |
| WO | 00/19498 | 4/2000 | | H01L/21/027 |

OTHER PUBLICATIONS

Wu, et al "Advanced Metal Barrier Free Cu Damascene Interconnects with PECVD Silicon Carbide Barriers for 90/65–nm BEOL Technology", 2002 IEEE, IEDM pp. 595–598.

U.S. patent application No. 09/270,039, filed on Mar. 16, 1999, Huang.

U.S. patent application No. 09/679,843, filed on Oct. 5, 2000, Gaillard, et al.

U.S. patent application No. 10/196,498, filed on Dec. 14, 2001, Lee, et al.

PCT patent application No. PCT/US99/22317, filed on Sep. 27, 1999.

PCT patent application No. PCT/US99/22425, filed on Sep. 27, 1999.

PCT patent application No. PCT/US99/22424, filed on Sep. 27, 1999.

Written Opinion, from PCT/US99/22424, dated Apr. 5, 2001.

PCT Partial International Search Report dated Mar. 21, 2000, for PCT/US99/22317.

PCT International Search Report dated Feb. 11, 2000 for PCT/US99/22425.

Ogawa et al., "Novel ARC Optimization Methodology for KrF Excimer Laser Lithography ae Low K1 Factor", *Proceedings of the SPIE. Optical/Laser Microlithography V*, vol. 1674, 1992, pp. 362–375.

Dijkstra et al., "Optimization of Anti–Reflection Layers for Deep UV Lithography", *Proceedings of SPIE Optical/Laser Microlithography, Bellingham, SPIE*, vol. 1927, 1993, pp. 275–286.

Omar, M.A., "Elementary Solid State Physics: Principles and Applications," Lowell Technological Institute, Addison–Wesley Publishing Company, © 1975, pp.: 124, 125.

* cited by examiner

METHOD FOR PRODUCING SEMICONDUCTOR INCLUDING FORMING A LAYER CONTAINING AT LEAST SILICON CARBIDE AND FORMING A SECOND LAYER CONTAINING AT LEAST SILICON OXYGEN CARBIDE

CROSS-REFERENCE TO RELATED APPLICATIONS

This application claims benefit of U.S. provisional patent application Ser. No. 60/397,184, filed Jul. 19, 2002, and is a continuation-in-part of U.S. patent application Ser. No. 10/196,498, filed Jul. 15, 2002, which claims benefit of U.S. provisional patent application Ser. No. 60/340,615, filed Dec. 14, 2001, all of which are herein incorporated by reference.

BACKGROUND OF THE INVENTION

1. Field of the Invention

Embodiments of the present invention generally relate to the fabrication of integrated circuits. More specifically, embodiments of the present invention generally relate to processes for depositing barrier layers on a substrate and structures that include the barrier layers.

2. Description of the Related Art

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having sub-quarter micron feature sizes, and tomorrow's plants soon will be producing devices having even smaller geometries.

In order to further reduce the size of devices on integrated circuits, it has become necessary to use conductive materials having low resistivity, such as copper, and insulators having low k (dielectric constant <4.0) to reduce the capacitive coupling between adjacent metal lines.

A barrier layer is typically deposited between subsequently deposited conductive materials and low k dielectric material to prevent diffusion of byproducts such as moisture onto the conductive materials. For example, moisture that can be generated during formation of a low k insulator readily diffuses to the surface of the conductive metal and increases the resistivity of the conductive metal surface.

A barrier layer can also be used to prevent diffusion of conductive materials. Low k dielectric materials are often porous and susceptible to interlayer diffusion of conductive materials, such as copper, which can result in the formation of short-circuits and device failure. A barrier layer is typically used in copper damascene structures to reduce or prevent interlayer diffusion.

Attempts have been made to deposit silicon carbide barrier layers by plasma enhanced chemical vapor deposition. However, silicon carbide barrier layers typically have had undesirable characteristics, such as unacceptable current leakage, and film instability, such as upon exposure to air. Silicon carbide layers doped with oxygen or nitrogen have shown some improvements in the areas of current leakage, compressive stress, and film stability. However, the nitrogen in nitrogen-doped silicon carbide layers can poison photoresist layers deposited on a substrate. The gases used to incorporate oxygen in oxygen-doped silicon carbide layers can oxidize underlying metal features on which the oxygen-doped silicon carbide layer is deposited.

Therefore, there remains a need for methods of depositing silicon carbide and oxygen-doped silicon carbide barrier layers with good chemical and mechanical properties.

SUMMARY OF THE INVENTION

Aspects of the invention generally provide methods for depositing a silicon carbide glue layer on a substrate, wherein the glue layer has improved current leakage without doping with oxygen or nitrogen. In one aspect, the invention provides a method for processing a substrate, including reacting a gas mixture comprising a carbon and silicon-containing compound and a member selected from the group of hydrogen, argon, and an aliphatic hydrocarbon comprising a carbon-carbon double bond or a carbon-carbon triple bond, such as ethylene, in a plasma and depositing a silicon carbide glue layer on the substrate. The gas mixture may also include helium.

In another aspect of the invention, a method is provided for depositing a barrier bilayer on a substrate, including reacting a gas mixture comprising an organosilicon compound, and a member selected from the group of hydrogen, argon, and an aliphatic hydrocarbon comprising a carbon-carbon double bond or a carbon-carbon triple bond, such as ethylene, in a plasma and depositing a silicon carbide glue layer on the substrate, reacting a second gas mixture in a plasma, and depositing an oxygen-containing silicon carbide barrier layer on the silicon carbide glue layer. In one embodiment, the oxygen-containing silicon carbide barrier layer may be deposited from a gas mixture comprising an organosilicon compound and an oxygen-containing gas having the formula $C_xH_yO_z$, with X being from 0 to 2, Y being from 0 to 2, and Z being from 1 to 3, wherein X+Y is at least 1 and X+Y+Z is 3 or less. In another embodiment, the oxygen-containing silicon carbide barrier layer may be deposited from a second gas mixture comprising an organosilicon compound and an oxygen-containing compound having the general formula

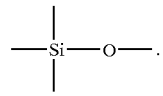

Optionally, the substrate may be pre-treated with a hydrogen plasma be ore the silicon carbide glue layer is deposited.

In another aspect of the invention, a method is provided for depositing a barrier bilayer on a substrate, including depositing a SiN or SiCN layer on the substrate, reacting a gas mixture in a plasma, and depositing an oxygen-containing silicon carbide barrier layer on the SiN or SiCN layer. The oxygen-containing silicon carbide barrier layer may be used as a cap layer on a SiN or SiCN layer. The oxygen-containing silicon carbide barrier layer may be deposited from a gas mixture comprising an organosilicon compound and an oxygen-containing gas having the formula $C_xH_yO_z$, with X being from 0 to 2, Y being from 0 to 2, and Z being from 1 to 3, wherein X+Y is at least 1 and X+Y+Z is 3 or less. Optionally, the substrate may be pre-treated with a hydrogen plasma before the silicon carbide glue layer is deposited.

In yet another aspect, a method is provided for depositing a silicon carbide hard mask on a substrate, including reacting a gas mixture comprising an organosilicon compound and a member selected from the group of hydrogen, argon, and and an aliphatic hydrocarbon comprising a carbon-carbon double bond or a carbon-carbon triple bond, such as ethylene, in a plasma and optionally depositing a second hard mask on the silicon carbide hard mask.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Silicon Carbide Glue Layers

Figure 1:
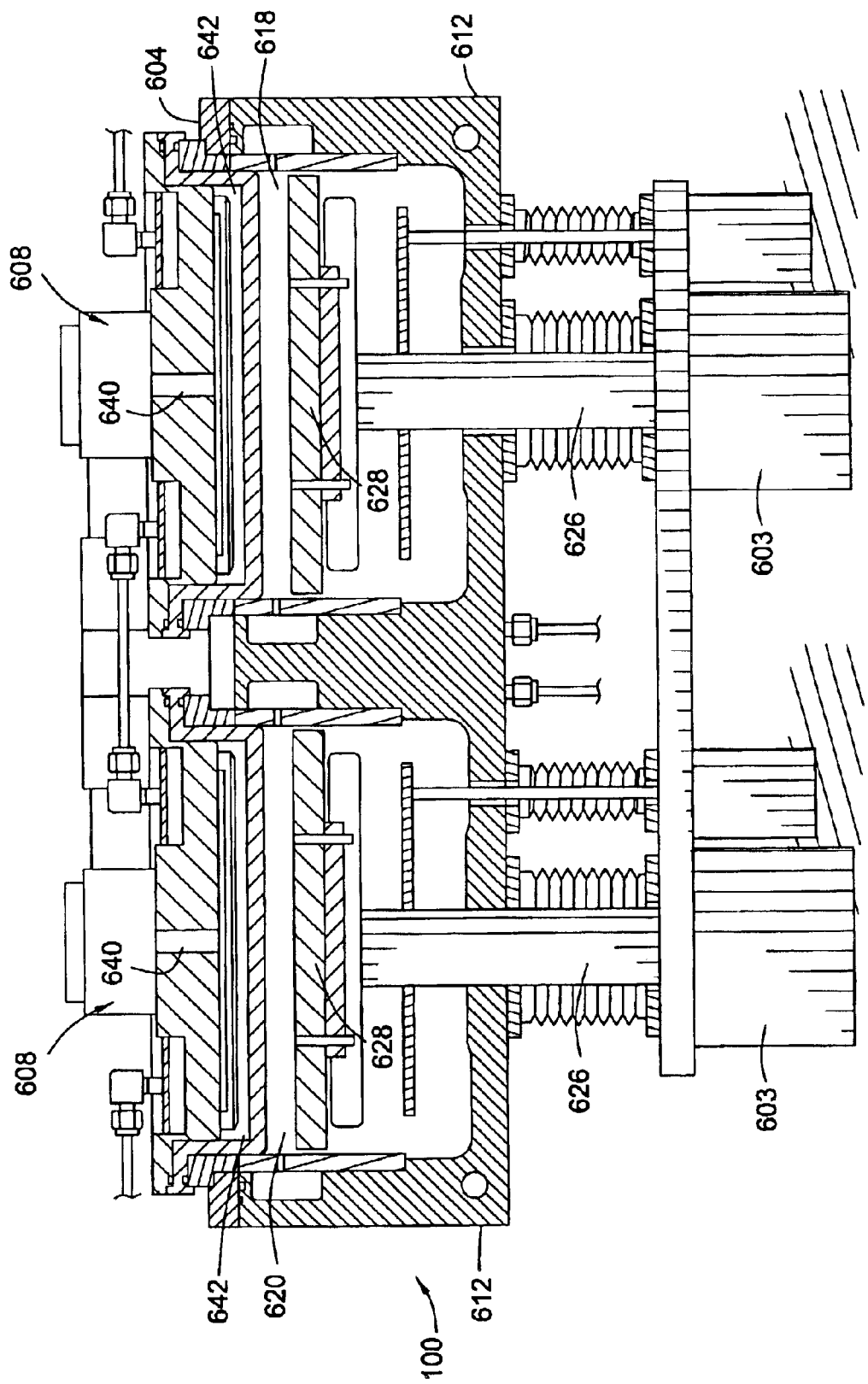
FIG. 1 is a cross-sectional view of a Producer® chamber.

Aspects of the invention provide methods for depositing an oxygen-doped silicon carbide layer on a substrate. The oxygen-doped silicon carbide layer may be a layer that is underneath or below a photoresist layer on a substrate. The oxygen-doped silicon carbide layer may be a layer that is deposited on a silicon carbide glue layer, a SiN layer, or a SiCN layer.

Aspects of the invention provide methods for depositing a silicon carbide glue layer or a silicon carbide hard mask on a substrate. As defined herein, a "silicon carbide glue layer" or a "silicon carbide hard mask" is a silicon carbide layer having reduced current leakage in comparison to conventional silicon carbide layers that do not contain oxygen or nitrogen. The silicon carbide layers described herein have significant and unexpected improvements in current leakage.

The silicon carbide glue layer may serve as a complete barrier layer itself, or the silicon carbide glue layer may be part of a barrier bilayer that includes a barrier layer in addition to the silicon carbide glue layer. The silicon carbide glue layer may be deposited on the substrate from a gas mixture comprising an organosilicon compound. The organosilicon compound may have the formula $SiH_a(CH_3)_b(C_2H_5)_c(C_6H_5)_d$, wherein a is 0 to 2, b is 0 to 4, c is 0 to 4, and d is 0 to 4. Alternatively, the organosilicon compound may have the general formula

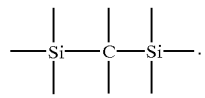

Alternatively, the organosilicon compound may have the general formula

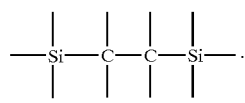

Preferably, the gas mixture does not include oxygen, nitrogen, or compounds with silicon-silicon bonds. Preferably, the gas mixture comprises trimethylsilane (TMS). The silicon carbide glue layer may be deposited on a surface of the substrate comprising part of a dielectric layer and part of a metal line disposed in the dielectric layer. The silicon carbide glue layers described herein are typically low k (k<4) layers.

In any of the embodiments or aspects described herein, the organosilicon compound used in the gas mixture to deposit the silicon carbide glue layer can be dimethylsilane, trimethylsilane, diethylsilane, diethylmethylsilane, disilanomethane, bis(methylsilano)methane, 1,2-disilanoethane, 1,2-bis(methylsilano)ethane, 2,2-disilanopropane, 1,3,5-trisilano-2,4,6-trimethylene, diphenylsilane, dimethylphenylsilane, diphenylmethylsilane, phenylmethylsilane, or combinations thereof.

In any of the embodiments or aspects described herein, a substrate upon which a silicon carbide glue layer described herein is deposited may be pre-treated with a hydrogen plasma. The pre-treatment with a hydrogen plasma may remove metal oxides, such as copper oxide, from the substrate surface. It was found that substrates including copper and pre-treated with a hydrogen plasma had a higher reflectivity than substrates including copper and pre-treated with an ammonia plasma. It is believed that the improved reflectivity is a result of removal of copper oxide from the substrate. The pre-treatment may be performed in the same chamber in which the silicon carbide glue layer is deposited. Hydrogen gas may be flowed into the chamber at a flow rate between about 300 sccm and about 1000 sccm. The substrate temperature may be between about 200° C. and about 400° C. The hydrogen gas may be reacted in the chamber at a pressure of between about 3 Torr and about 7 Torr. A RF power of between about 100 watts and about 600 watts may be applied in the chamber. The spacing between the gas distributor in the chamber and the substrate may be between about 200 mils and about 600 mils.

Methods of forming the silicon carbide glue layers described herein are preferably performed in a processing chamber adapted to deposit organosilicon material while applying RF power. For example, a Producer® chemical vapor deposition chamber, commercially available from Applied Materials, Inc., of Santa Clara, Calif. may be used. An example of a Producer® Chamber is described in U.S. Pat. No. 5,855,681, which is incorporated by reference herein. A brief description of a Producer® Chamber will be given with respect to FIG. 1.

FIG. 1 shows a cross sectional view of a chamber 100. The chamber 100 has processing regions 618 and 620. A heater pedestal 628 is movably disposed in each processing region 618, 620 by a stem 626 which extends through the bottom of the chamber body 612 where it is connected to a drive system 603. Each of the processing regions 618, 620 also preferably include a gas distribution assembly 608 disposed through the chamber lid 604 to deliver gases into the processing regions 618, 620. The gas distribution assembly 608 of each processing region also includes a gas inlet passage 640 which delivers gas into a shower head assembly 642.

The flow rates described herein for introducing gases into a plasma processing chamber are given with respect to the total processing area in a Producer chamber, i.e., both processing regions. Thus, the flow rates into each processing region of the Producer chamber are approximately half of the flow rates described herein.

In one aspect, a silicon carbide glue layer may be deposited on a substrate by reacting a gas mixture comprising an organosilicon compound, and an aliphatic hydrocarbon comprising a carbon-carbon double bond or a carbon-carbon triple bond, such as ethylene, and optionally, helium, in a plasma provided in a plasma processing chamber.

Preferably, the organosilicon compound is trimethylsilane, and the aliphatic hydrocarbon comprising a carbon-carbon double bond or a carbon-carbon triple bond is ethylene ($C_2H_4$). A silicon carbide glue layer may be deposited in one embodiment by introducing into a plasma processing chamber an organosilicon compound at a flow rate between about 50 and about 300 sccm, and an aliphatic hydrocarbon comprising a carbon-carbon double bond or a carbon-carbon triple bond, at a flow rate between about 50 and about 500 sccm, such as between about 100 and about 500 sccm, and optionally, helium at a flow rate between about 0 and about 1000 sccm. Preferably, helium is introduced into the chamber at a flow rate of less than about 400 sccm. The gas mixture may be reacted in a plasma processing chamber at a pressure of between about 2 Torr and about 10 Torr, such as between about 2 and about 5 Torr. The substrate temperature may be between about 200° C. and about 400° C., such as between about 300° C. and about 400° C. A RF power of between about 100 watts and about 700 watts, such as between about 300 watts and about 700 watts, or between about 100 watts and about 600 watts, may be applied in a plasma processing chamber for processing 300 mm substrates. A RF power of between about 100 watts and about 700 watts, such as between about 100 watts and about 600 watts, may be applied in a plasma processing chamber for processing 200 mm substrates. The RF power can be provided at a high frequency such as between about 13 and about 14 MHz, such as 13.56 MHz. The gas mixture may be introduced into the chamber by a gas distributor that may be positioned between about 300 mils and about 500 mils from the substrate surface.

In another aspect, a silicon carbide glue layer may be deposited on a substrate by reacting a gas mixture comprising an organosilicon compound and a gas selected from the group of hydrogen and argon in a plasma provided in a plasma processing chamber. Preferably, the organosilicon compound is trimethylsilane. In one embodiment, a silicon carbide glue layer may be deposited by introducing into a plasma processing chamber an organosilicon compound at a flow rate between about 50 and about 350 sccm and hydrogen at a flow rate between about 100 and about 500 sccm. The gas mixture may be reacted in a plasma processing chamber at a pressure of between about 3 Torr and about 12 Torr. The substrate temperature may be between about 200° C. and about 400° C. A RF power of between about 200 watts and about 700 watts, preferably between about 300 watts and about 700 watts, may be applied in a plasma processing chamber for processing 300 mm sustrates. A RF power of between about 200 watts and about 700 watts may be applied in a plasma processing chamber for processing 200 mm substrates. The RF power can be provided at a high frequency such as between about 13 and about 14 MHz, such as 13.56 MHz. In another embodiment, a silicon carbide glue layer may be deposited by introducing into a plasma processing chamber an organosilicon compound at a flow rate between about 50 and about 350 sccm and argon at a flow rate between about 100 and about 500 sccm. The gas mixture may be reacted in a plasma processing chamber at a pressure of between about 3 Torr and about 12 Torr. The substrate temperature may be between about 200° C. and about 400° C. A RF power of between about 200 watts and about 700 watts, preferably between about 300 watts and about 700 watts, may be applied in a plasma processing chamber for processing 300 mm sustrates. A RF power of between about 200 watts and about 700 watts may be applied in a plasma processing chamber for processing 200 mm substrates. The RF power can be provided at a high frequency such as between about 13 and about 14 MHz.

Barrier Bilayers with Silicon Carbide Glue Layers

In another aspect, a barrier bilayer may be deposited on a substrate by first depositing a silicon carbide glue layer by reacting a gas mixture comprising an organosilicon compound, and an aliphatic hydrocarbon comprising a carbon-carbon double bond or a carbon-carbon triple bond, such as ethylene, and optionally, helium, in a plasma provided in plasma processing chamber, and then depositing a barrier layer on the substrate. Preferably, the organosilicon compound is trimethylsilane. In one example, the silicon carbide glue layer may be about 80 Å thick, and the barrier layer may be about 420 Å thick, resulting in a 500 Å barrier bilayer. A silicon carbide glue layer may be deposited in one embodiment by introducing into a plasma processing chamber an organosilicon compound at a flow rate between about 50 and about 300 sccm, an aliphatic hydrocarbon comprising a carbon-carbon double bond or a carbon-carbon triple bond, such as ethylene, at a flow rate between about 50 and about 500 sccm, such as between about 100 and about 500 sccm, and optionally, helium at a flow rate between about 0 and about 1000 sccm. Preferably, helium is introduced into the chamber at a flow rate of less than about 400 sccm. The gas mixture may be reacted in a plasma processing chamber at a pressure of between about 2 Torr and about 10 Torr, such as between about 2 and about 5 Torr. The substrate temperature may be between about 200° C. and about 400° C., such as between about 300° C. and about 400° C. A RF power of between about 100 watts and about 700 watts, such as between about 300 watts and about 700 watts, or between about 100 watts and about 600 watts may be applied in a plasma processing chamber for processing 300 mm sustrates. A RF power of between about 200 watts and about 700 watts may be applied in a plasma processing chamber for processing 200 mm substrates. The RF power can be provided at a high frequency such as between about 13 and about 14 MHz, such as about 13.56 MHz. The gas mixture may be introduced into the chamber by a gas distributor that may be positioned between about 300 mils and out 500 mils from the substrate surface.

In another aspect, a barrier bilayer may be deposited on a substrate by first depositing a silicon carbide glue layer by reacting a gas mixture comprising an organosilicon compound and a gas selected from the group of hydrogen and argon in a plasma provided in a plasma processing chamber, and then depositing a barrier layer on the substrate. Preferably, the organosilicon compound is trimethylsilane. In one example, the silicon carbide glue layer may be about 80 Å thick, and the barrier layer may be about 420 Å thick, resulting in a 500 Å barrier bilayer. In one embodiment, a silicon carbide glue layer may be deposited by introducing into a plasma processing chamber an organosilicon compound at a flow rate between about 50 and about 350 sccm and hydrogen at a flow rate between about 100 and about 500 sccm. The gas mixture may be reacted in a plasma processing chamber at a pressure of between about 3 Torr and about 12 Torr. The substrate temperature may be between about 200° C. and about 400° C. A RF power of between about 200 watts and about 700 watts, preferably between about 300 watts and about 700 watts, may be applied in a plasma processing chamber for processing 300 mm sustrates. A RF power of between about 200 watts and about 700 watts may be applied in a plasma processing chamber for processing 200 mm substrates. The RF power can be provided at a high frequency such as between about 13 and about 14 MHz, such as about 13.56 MHz. In another embodiment, a silicon carbide glue layer may be deposited by introducing into a plasma processing chamber an organosilicon compound at a flow rate between about 50 and about 350 sccm and argon at a flow rate between about 100 and about 500 sccm. The gas mixture may be reacted in a plasma processing chamber at a pressure of between about watts 3 Torr and about 12 Torr. The substrate temperature may be between about 200° C. and about 400° C. A RF power of between about 200 watts and about 700 watts, preferably between about 300 watts and about 700 watts, may be applied in a plasma processing chamber for processing 300 mm sustrates. A RF power of between about 200 watts and about 700 watts may be applied in a plasma processing chamber for processing 200 mm substrates. The RF power can be provided at a high frequency such as between about 13 and about 14 MHz, such as about 13.56 MHz.

While a preferred thickness of the silicon carbide glue layers described herein in barrier bilayers is about 80 Å, other thickness of the silicon carbide glue layers may be used. For example, a silicon carbide layer of between about 50 Å and about 100 Å may be used. A desired thickness of the silicon carbide glue layer can be determined by exposing a substrate containing the silicon carbide glue layer over an underlying metal feature, such as copper, to a plasma containing oxygen. A change in the reflectivity of the metal indicates that the metal has been oxidized, and thus is not protected sufficiently by the glue layer. This minimum thickness of glue layer that results in substantially no change in the metal reflectivity can be selected as the desired thickness of the silicon carbide glue layer.

In embodiments in which the silicon carbide glue layer is part of a barrier bilayer that also includes a barrier layer, the barrier layer may be an oxygen-doped silicon carbide layer that contains no nitrogen or is substantially nitrogen free. The barrier layer may be deposited on the silicon carbide glue layer by reacting a gas mixture comprising an oxygen-containing compound and an organosilicon compound. The barrier layer may be deposited by reacting a gas mixture comprising an oxygen-containing organosilicon compound with an oxygen-free organosilicon compound. Suitable oxygen-free organosilicon compounds include methylsilane, dimethylsilane, trimethylsilane, ethylsilane, disilanomethane, bis(methylsilano)methane, 1,2-disilanoethane, 1,2-bis(methylsilano)ethane, 2,2-disilanopropane, and 1,3,5-trisilano-2,4,6-trimethylene. Suitable oxygen-containing organosilicon compounds include dimethyldimethoxysilane, 1,3-dimethyldisiloxane, 1,1,3,3-tetramethyldisiloxane, hexamethyldisiloxane, 1,3-bis(silanomethylene)disiloxane, bis(1-methyldisiloxanyl)methane, 2,2-bis(1-methyidisiloxanyl)propane, 1,3,5,7-tetramethylcyclotetrasiloxane, octamethylcyclotetrasiloxane, 2,4,6,8,10-pentamethylcyclopentasiloxane, 1,3,5,7-tetrasilano-2,6-dioxy-4,8-dimethylene, and hexamethylcyclotrisiloxane. The oxygen-containing compound may include carbon dioxide, CO, or water. For example, a gas mixture comprising trimethylsilane, helium, and carbon dioxide may be reacted in a plasma in a plasma processing chamber. Precursors and processing conditions for the deposition of an oxygen-doped silicon carbide layer are also described in commonly assigned U.S. patent application Ser. No. 10/196, 498, filed Jul. 15, 2002, and entitled "A Method of Depositing Dielectric Materials in Damascene Applications," which is incorporated by reference herein. However, other methods may be used to deposit the barrier layer.

In one embodiment, an oxygen-doped silicon carbide barrier layer may be deposited by supplying an organosilicon compound, such as TMS, to a plasma processing chamber at a flow rate between about 50 sccm and about 300 sccm, supplying an oxygen-containing gas, such as $CO_2$, at a flow rate between about 100 sccm and about 800 sccm, supplying an inert gas, such as helium, at a flow rate between about 200 sccm and about 800 sccm, maintaining a substrate temperature between about 300° C. and about 400° C., maintaining a chamber pressure between about 2 Torr and about 5 Torr, a RF power of between about 200 watts and about 500 watts, and a spacing of the gas distributor of the chamber from the substrate of between about 300 mils and about 400 mils. The oxygen-containing gas generally has the formula $C_xH_yO_z$, with X being from 0 to 2, Y being from 0 to 2, and Z being from 1 to 3, wherein X+Y is at least 1 and X+Y+Z is 3 or less. Thus, the oxygen-containing gas may include carbon dioxide, CO, or water. The oxygen-containing gas is typically an inorganic material. The oxygen-containing gas described herein is considered a non-oxidizing gas compared to oxygen or ozone. Oxygen-doped silicon carbide barrier layers were deposited according to the processes described herein, and the layers were analyzed. FTIR spectra (not shown) of the layers measured over two weeks were stable, suggesting that the composition of the layers is stable and that the layers do not absorb a significant amount of moisture. It was also found that the dielectric constant and the stress of the film did not change significantly one week after deposition. Secondary ion mass spectroscopy (SIMS) was performed to determine the amount of copper diffusion through the barrier layers. The amount of copper that diffused through the films decreased by 3 orders of magnitude over 200 Å, indicating that the films are effective copper barriers.

In another embodiment, an oxygen-doped silicon carbide barrier layer may be deposited as described above, except that an oxygen-containing compound having the general formula

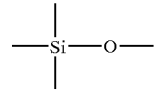

is used instead of an oxygen-containing gas having the general formula $C_xH_yO_z$, with X being from 0 to 2, Y being from 0 to 2, and Z being from 1 to 3, wherein X+Y is at least 1 and X+Y+Z is 3 or less. In one example, an oxygen-doped silicon carbide barrier layer is deposited from a gas mixture comprising diethylmethylsilane and tetramethyldisiloxane or dimethyldimethoxysilane. In any of the embodiments described herein in which an oxygen-doped silicon carbide barrier layer is deposited using an oxygen-containing gas having the general formula $C_xH_yO_z$, with X being from 0 to 2, Y being from 0 to 2, and Z being from 1 to 3, wherein X+Y is at least 1 and X+Y+Z is 3 or less, an oxygen-containing compound having the general formula

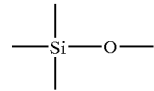

may be used instead of the oxygen-containing gas.

It was found that increasing the amount of oxygen-containing gas or oxygen-containing compound relative to the organosilicon compound in the deposition of the oxygen-doped silicon carbide layer lowers the dielectric constant of the deposited films by increasing the number of Si—O bonds in the deposited layers. However, too much oxygen doping of the barrier layers may decrease etch selectively between the barrier layers and adjacent dielectric layers that may contain oxygen, resulting in an increased amount of copper diffusion into the barrier layers.

Table 1 shows a comparison of barrier layer properties of oxygen-doped silicon carbide layers deposited by the processes described herein and conventional oxygen-free silicon carbide layers. The oxygen-doped barrier layers typically have a lower dielectric constant and a lower current leakage than the oxygen-free barrier layers.

TABLE 1

| Film Properties | Oxygen-doped SiC | Oxygen-free SiC |
| --- | --- | --- |
| Refractive index (RI) | 1.75~1.80 | >2.00 |
| Dielectric constant (k) | 4.0~4.2 | >4.4 |
| Leakage (A/cm$^2$ at 2 MV/cm) | 2.0~4.0 E-9 | >E-8 |
| Breakdown (MV/cm at 1 mA) | >5 | >3.5 |
| Stress (dyne/cm$^2$) | −1.7~−2.0 E9 | −3.0~−4.5 E8 |
| Hardness (Gpa) | >8 | >5 |
| Elastic modulus (Gpa) | >50 | >40 |
| Oxygen concentration | 5~15% | Not Determined |

Figure 2:
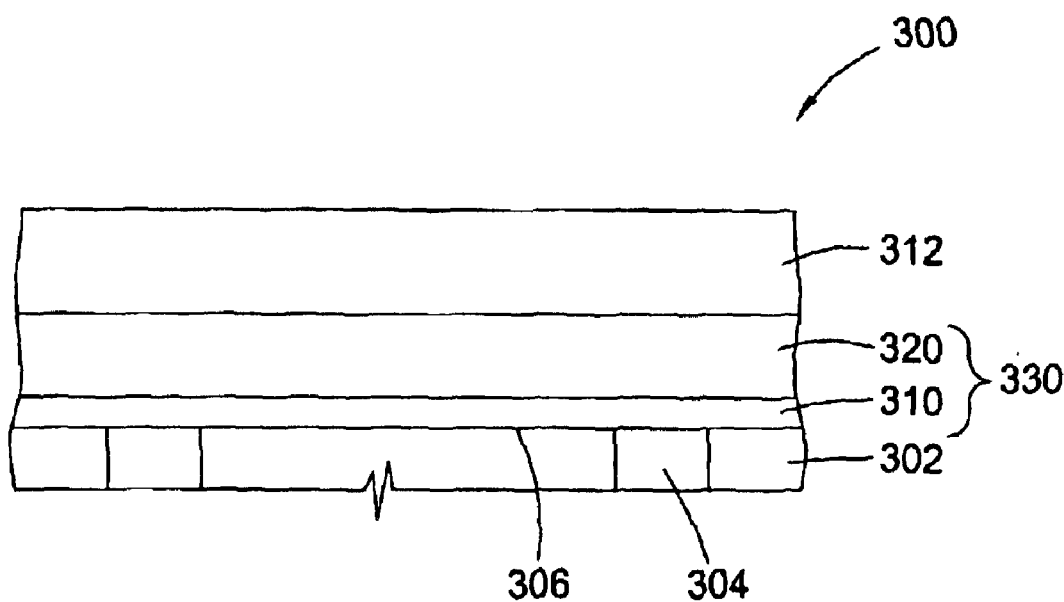
FIG. 2 is a cross-sectional view showing a device of an embodiment of the invention comprising a silicon carbide glue layer.

In another aspect, devices including embodiments of silicon carbide glue layers described herein are provided. FIG. 2 shows a device 300 comprising a dielectric layer 302 having a metal feature 304 formed therein. The metal feature 304 extends to a surface 306 of the dielectric layer 302. A silicon carbide silicon carbide glue layer 310 is formed on the surface of the dielectric layer 302. In one embodiment, the silicon carbide layer 310 is formed by reacting a gas mixture comprising an organosilicon compound, an aliphatic hydrocarbon comprising a carbon-carbon double bond or a carbon-carbon triple bond, such as ethylene, and optionally, helium, in a plasma in a plasma processing chamber and depositing a thin film on the surface 306 of the dielectric layer. In another embodiment, the silicon carbide layer 310 is formed by reacting a gas mixture comprising an organosilicon compound and a gas selected from the group of hydrogen and argon in a plasma in a plasma processing chamber and depositing a thin film on the surface 306 of the dielectric layer. In either embodiment, preferably, the organosilicon compound is trimethylsilane. The silicon carbide layer 310 may serve as a barrier layer that separates the metal feature 304 in the dielectric layer 302 from an additional layer 312, such as a dielectric layer, deposited on the silicon carbide layer 310 if an additional barrier layer is not deposited on the layer 310 before the dielctric layer 312 is deposited. The dielectric layer 312 may be a low dielectric constant material such as Black Diamond™ films, commercially available from Applied Materials, Inc., of Santa Clara, Calif. and SILK® films, available from Dow Chemical Company. The dielectric layer 312 may also comprise other low dielectric constant materials including polymer materials, such as parylene, or low k spin-on glass such as an un-doped silicon glass (USG) or fluorine-doped silicon glass (FSG).

Optionally, the device 300 may also include a barrier layer 320 on the silicon carbide layer 310. The barrier layer 320 may be an oxygen-doped silicon carbide layer. The barrier layer 320 may be formed by reacting a gas mixture comprising trimethylsilane, helium, and carbon dioxide in a plasma in a plasma processing chamber. Thus, the device comprises a barrier bilayer 330 that includes the silicon carbide layer 310 and the barrier layer 320. The barrier bilayer 330 separates the metal feature 304 in the dielectric layer 302 from the additional layer 312 deposited on the barrier layer 320.

We have found that silicon carbide glue layers deposited according to the embodiments described herein have significantly and unexpectedly improved properties, such as leakage currents and breakdown voltages, compared to layers deposited by reacting a gas mixture of trimethylsilane and helium. An example of typical resulting properties of silicon carbide glue layers deposited from different gas mixtures is shown below in Table 2. The leakage currents of layers deposited according to embodiments described herein, i.e., a trimethylsilane and hydrogen gas mixture, a trimethylsilane, ethylene, and helium gas mixture, and a trimethylsilane and ethylene gas mixture, are typically lower than the leakage current of a layer deposited from a gas mixture of helium and trimethylsilane. The leakage current of layers deposited according to embodiments described herein may be an order of magnitude lower than the leakage current of a layer deposited from a gas mixture of trimethylsilane and helium. Leakage current typically increases with degrading barrier layer properties. The breakdown voltages of layers deposited according to embodiments described herein are typically higher than the breakdown voltage of a layer deposited from a gas mixture of trimethylsilane and helium. However, the uniformity, i.e., the uniformity of the layer surface measured by an optical test across the surface, of the layers described herein is typically not as good as the uniformity of a layer deposited from a gas mixture of trimethylsilane and helium.

TABLE 2

| layer properties | trimethylsilane, helium | trimethylsilane, hydrogen | trimethylsilane, ethylene, helium | trimethylsilane, ethylene |
| --- | --- | --- | --- | --- |
| dielectric constant (@ 0.1 MHz) | 4.17 | 3.88 | 3.73 | 3.81 |
| leakage current @ 1 MV/cm in A/cm$^2$ | 6.8 × 10$^{-9}$ | 3.1 × 10$^{-9}$ | 2.3 × 10$^{-9}$ | 2.0 × 10$^{-9}$ |
| leakage current @ 2 MV/cm in A/cm$^2$ | 1.6 × 10$^{-7}$ | 6.1 × 10$^{-8}$ | 3.1 × 10$^{-8}$ | 4.6 × 10$^{-9}$ |
| breakdown voltage in MV/cm | 3.7 | 4.3 | 4.5 | 4.1 |
| uniformity (%) | 1.5 | 5 | 2.5 | 2.7 |

It is believed that the layers deposited from a mixture of trimethylsilane and helium have less desirable properties than the layers deposited from a mixture of an organosilicon compound, such as trimethylsilane, and hydrogen or argon because helium may cause damage to deposited layers during the plasma deposition process. Damaged layers may be more likely to have current leakage problems. It is believed that hydrogen and argon do not result in the damage to the layers that helium may cause. For example, it is believed that hydrogen and argon do not contribute as much as helium may to the formation the broken bonds in the deposition layer that may lead to silicon-silicon bond formation in the deposited layers. Silicon-silicon bonds are undesirable in a barrier layer because of their semiconducting properties, which can contribute to current leakage.

It is believed that the layers deposited from a mixture of an organosilicon compound, such as trimethylsilane, and helium have less desirable properties than the layers deposited from a mixture of an organosilicon compound, such as trimethylsilane, an aliphatic hydrocarbon comprising a carbon-carbon double bond or a carbon-carbon triple bond, such as ethylene, and optionally, helium, because it is expected that the decomposition of an organosilicon compound during the deposition process can lead to the formation of more silicon-silicon (Si—Si) bonds in a mixture of an organosilicon compound and helium than in a mixture of an aliphatic hydrocarbon comprising a carbon-carbon double bond or a carbon-carbon triple bond, such as ethylene, an organosilicon compound, and optionally, helium. Silicon-silicon bonds are undesirable in a barrier layer because of their semiconducting properties, which can contribute to current leakage. It is believed that the addition of the aliphatic hydrocarbon comprising a carbon-carbon double bond or a carbon-carbon triple bond, to a mixture including an organosilicon compound contributes to the formation of Si—C—Si bonds in the deposited layer rather than Si—Si bonds.

In the embodiments described herein, the silicon carbide glue layer may be deposited from a mixture including a precursor or precursors having the formulae $SiH_a(CH_3)_b(C_2H_5)_c(C_6H_5)_d$, wherein a is 0 to 2, b is 0 to 4, c is 0 to 4, and d is 0 to 4,

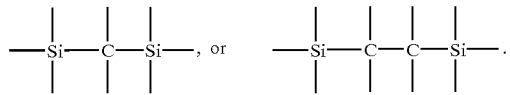

Endo et al., U.S. Pat. No. 4,532,150, describes mixing ethylene with precursors containing Si—Si bonds to form silicon carbide films. It should be noted that organosilicon compounds containing Si—Si bonds are not described herein. It is believed that depositing a layer from a gas mixture comprising a precursor containing Si—Si bonds contributes to the formation of Si—Si bonds in the deposited layer, and significantly increases current leakage.

Figure 3:
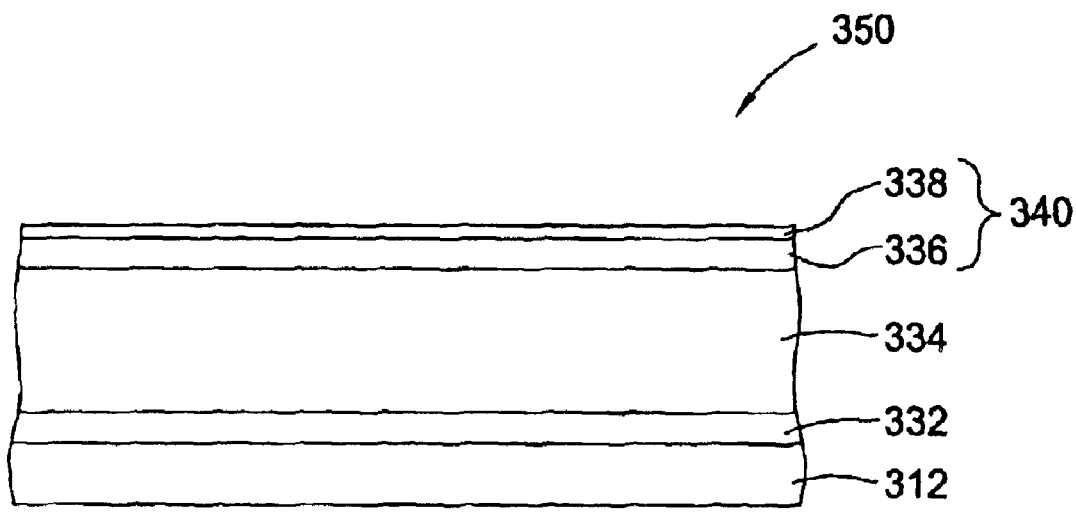
FIG. 3 is a cross-sectional view showing a device of an embodiment of the invention comprising a silicon carbide hard mask.

While the silicon carbide glue layers described herein have been discussed primarily as barrier layers or components of barrier bilayers, the silicon carbide glue layers described herein may also be used as hard masks. FIG. 3 shows an example of a device 350 incorporating a silicon carbide layer as a hard mask. An etch stop 332, such as silicon carbide or nitrogen-doped silicon carbide is deposited on a dielectric layer 312 that is equivalent to the dielectric layer 312 of FIG. 2. Another dielectric layer 334 is deposited on the etch stop 332. A silicon carbide hard mask layer 336 is then deposited on the dielectric layer 334. The silicon carbide hard mask layer 336 may serve as a hard mask by itself, or it may have another hard mask layer 338, such as a silicon oxide, deposited on it to form a hard mask bilayer 340. The hard mask bilayer 340 provides two layers of protection for the device during subsequent processing steps, such as chemical mechanical polishing (CMP) of the device and etching the device to form vias and trenches. Preferably, the hard mask layer 338 has sufficiently different etching properties such that the hard mask layer 338 and the silicon carbide hard mask layer 336 can be etched differently to provide different etch patterns for vias and trenches.

EXAMPLES

Example 1

A silicon carbide glue layer was deposited at a chamber pressure of 5 Torr and temperature of 350° C. from gases which were flowed into a plasma processing chamber as follows:

| | |
|---|---|
| trimethylsilane, at | 160 sccm |
| ethylene, at | 200 sccm |
| helium, at | 200 sccm |

The substrate was positioned 400 mil from the gas distribution showerhead and 450 watts of high frequency power at 13.56 MHz was applied to the showerhead for plasma enhanced deposition of a silicon carbide silicon carbide glue layer. The silicon carbide glue layer was deposited at a rate of about 886 Å/min, and had a dielectric constant of about 3.73, a uniformity of about 2.5%, a leakage current of about $2.32 \times 10^{-9}$ A/cm$^2$ at 1 MV/cm, a leakage current of about $3.06 \times 10^{-8}$ A/cm$^2$ at 2 MV/cm, and a breakdown voltage of about 4.47 MV/cm.

Example 2

A silicon carbide glue layer was deposited at a chamber pressure of 3 Torr and temperature of 350° C. from gases which were flowed into a plasma processing chamber as follows:

| | |
|---|---|
| trimethylsilane, at | 150 sccm |
| ethylene, at | 200 sccm. |

The substrate was positioned 400 mil from the gas distribution showerhead and 600 watts of high frequency power at 13.56 MHz was applied to the showerhead for plasma enhanced deposition of a silicon carbide silicon carbide glue layer. The silicon carbide glue layer was deposited at a rate of about 1255 Å/min, and had a dielectric constant of about 3.81, a uniformity of about 2.7%, a leakage current of about $2.04 \times 10^{-9}$ A/cm$^2$ at 1 MV/cm, a leakage current of about $4.64 \times 10^{-8}$ A/cm$^2$ at 2 MV/cm, and a breakdown voltage of about 4.13 MV/cm.

Example 3

A silicon carbide glue layer was deposited at a chamber pressure of 9.5 Torr and temperature of 350° C. from gases which were flowed into a plasma processing chamber as follows:

| | |
|---|---|
| trimethylsilane, at | 160 sccm |
| hydrogen, at | 200 sccm. |

The substrate was positioned 400 mil from the gas distribution showerhead and 450 watts of high frequency power at 13.56 MHz was applied to the showerhead for plasma enhanced deposition of a silicon carbide silicon carbide glue layer. The silicon carbide glue layer was deposited at a rate of about 161 Å/min, and had a dielectric constant of about 3.88, a uniformity of about 5%, a leakage current of about $3.1 \times 10^{-9}$ A/cm$^2$ at 1 MV/cm, a leakage current of about $6.1 \times 10^{-8}$ A/cm$^2$ at 2 MV/cm, and a breakdown voltage of about 4.3 MV/cm.

Example 4

A silicon carbide glue layer was deposited at a chamber pressure of 9.5 Torr and temperature of 350° C. from gases which were flowed into a plasma processing chamber as follows:

| | |
|---|---|
| trimethylsilane, at | 160 sccm |
| argon, at | 200 sccm. |

The substrate was positioned 400 mil from the gas distribution showerhead and 450 watts of high frequency power at 13.56 MHz was applied to the showerhead for plasma enhanced deposition of a silicon carbide silicon carbide glue layer. The silicon carbide glue layer was deposited at a rate of about 713 Å/min, and a dielectric constant of about 4.0, a uniformity of about 1.9%, a leakage current of about $2.8 \times 10^{-9}$ A/cm$^2$ at 1 MV/cm, a leakage current of about $4.3 \times 10^{-8}$ A/cm$^2$ at 2 MV/cm, and a breakdown voltage of about 3.63 MV/cm.

Example 5

A barrier layer was deposited on one of the silicon carbide glue layers deposited as in Examples 1–4. The barrier layer was deposited at a chamber pressure of 3.5 torr and temperature of 350° C. from gases which were flowed into a plasma processing chamber as follows:

| | |
|---|---|
| trimethylsilane, at | 100 sccm |
| helium, at | 400 sccm |
| carbon dioxide, at | 350 sccm. |

The substrate was positioned 350 mil from the gas distribution showerhead and 400 watts of high frequency power at 13.56 MHz was applied to the showerhead for plasma enhanced deposition of an oxygen-doped silicon carbide barrier layer. The barrier layer was deposited at a rate of about 920 Å/min, and a dielectric constant of about 3.88, a uniformity of about 1.1%, a leakage current of about $4.2 \times 10^{-10}$ A/cm$^2$ at 1 MV/cm, a leakage current of about $3.6 \times 10^{-9}$ A/cm$^2$ at 2 MV/cm, a breakdown voltage of about 5.24 MV/cm. The compressive stress of the barrier layer was about $1.82 \times 10^{-9}$ dyne/cm$^2$.

Barrier Bilayers with SiN or SiCN Layers

In another aspect, a barrier bilayer may be deposited on a substrate by first depositing a SiN or SiCN layer on a substrate, and then depositing an oxygen-doped silicon carbide barrier layer on the substrate. The oxygen-doped barrier layer may be deposited by the processes described herein for depositing an oxygen-doped silicon carbide barrier that is part of a barrier bilayer that also contains a silicon carbide glue layer. The SiN or SiCN layer may be deposited using conventional techniques for SiN and SiCN deposition. Examples of processing gases and conditions that may be used to deposit SiCN layers are described in U.S. patent application Ser. No. 09/793,818, filed Feb. 23, 2001, which is incorporated by reference herein.

A device including the barrier bilayer is also provided. While FIG. 2 was described above with respect to a device including a barrier bilayer having a silicon carbide layer 310, the layer 310 may alternatively represent a SiN or SiCN layer.

One advantage of the methods and devices described herein that include barrier bilayers is that a photoresist may be deposited directly on the oxygen-doped silicon carbide layer of the barrier bilayer without subjecting the photoresist to nitrogen poisoning.

While the foregoing is directed to embodiments of the present invention, other and further embodiments of the invention may be devised without departing from the basic scope thereof, and the scope thereof is determined by the claims that follow.

What is claimed is:

1. A method for processing a substrate, comprising:
   depositing an phenyl containing silicon carbide layer on the substrate by reacting a first gas mixture comprising hydrogen, an inert gas, and a phenylsilane compound in a plasma; and
   depositing an oxygen-doped silicon carbide layer on the phenyl containing silicon carbide layer by reacting a second gas mixture comprising trimethylsilane.

2. The method of claim 1, wherein the phenylsilane compound is selected from the group consisting of diphenylsilane, dimethylphenylsilane, diphenylmethylsilane, phenylmethylsilane, an combinations thereof.

3. The method of claim 2, wherein the first gas mixture further comprises an aliphatic hydrocarbon comprising carbon-carbon double bond or a carbon-carbon triple bond.

4. The method of claim 3, wherein the aliphatic hydrocarbon is ethylene.

5. The method of claim 1, wherein the inert gas comprises helium, argon, or combinations thereof.

6. The method of claim 1, further comprising depositing a low dielectric constant material on the oxygen-doped silicon carbide layer.

7. The method of claim 1, wherein the second gas mixture further comprises an oxygen-containing compound having the general formula:

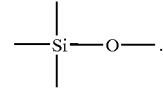

8. The method of claim 7, wherein the oxygen-containing compound is selected from the group consisting of tetramethyldisiloxane and dimethyldimethoxysilane.

9. The method of claim 1, wherein the second gas mixture further comprises an oxygen-containing gas having the formula $C_XH_YO_Z$, with X being from 0 to 2, Y being from 0 to 2, and Z being from 1 to 3, wherein X+Y is at least 1 and X+Y+Z is 3 or less.

10. The method of claim 9, wherein the second gas mixture further comprises an inert gas.

11. The method of claim 10, wherein the oxygen-containing as is carbon dioxide and the inert gas is helium.

12. The method of claim 9, wherein the trimethylsilane is introduced into a processing chamber at a flow rate between about 50 sccm and about 300 sccm and the oxygen-containing gas is introduced into the processing chamber at a flow rate between a out 100 sccm and about 800 sccm.

13. A method for processing a substrate, comprising:
   pre-treating a substrate with a hydrogen plasma;
   depositing an phenyl containing silicon carbide layer on the substrate by reacting a first gas mixture comprising hydrogen, an inert gas, and a phenylsilane compound in a plasma and depositing a silicon carbide layer on the substrate; and
   reacting a second gas mixture comprising trimethylsilane and an oxygen-containing gas having the formula $C_XH_YO_Z$, with X being from 0 to 2, Y being from 0 to 2, and Z being from 1 to 3, wherein X+Y; s at least 1 and X+Y+Z is 3 or less, in a plasma and depositing an oxygen-doped silicon carbide layer on the phenyl containing silicon carbide layer.

14. The method of claim 13, wherein the phenylsilane compound is selected from the group consisting of diphenylsilane, dimethylphenylsilane, diphenylmethylsilane, phenylmethylsilane, and combinations thereof.

15. The method of claim 14, wherein the first gas mixture further comprises an aliphatic hydrocarbon comprising carbon-carbon double bond or a carbon-carbon triple bond.

16. The method of claim 15, wherein the aliphatic hydrocarbon is ethylene.

17. The method of claim 13, wherein the inert gas comprises helium, argon, or combinations thereof.

18. The method of claim 13, wherein the second gas mixture further comprises an inert gas.

19. The method of claim 18, wherein the oxygen-containing gas is carbon dioxide and the inert gas is helium.

20. The method of claim 13, wherein the trimethylsilane is introduced into a processing chamber at a flow rate between about 50 sccm and about 300 sccm and the oxygen-containing gas is introduced into the processing chamber at a flow rate between about 100 sccm and about 800 sccm.

21. The method of claim 13, further comprising depositing a photoresist on the oxygen-doped silicon carbide layer.

22. A method for processing a substrate, comprising:

depositing a layer comprising silicon, carbon, and nitrogen, on the substrate; and reacting a gas mixture comprising an organosilicon compound and carbon dioxide in a plasma and depositing an oxygen-doped silicon carbide layer on the substrate.

23. The method of claim 22, wherein the gas mixture further comprises an inert gas.

24. The method of claim 23, wherein the organosilicon compound is trimethylsilane and the inert gas is helium.

25. The method of claim 22, wherein the organosilicon compound is introduced into a processing chamber at a flow rate between about 50 sccm and about 300 sccm, end carbon dioxide is introduced into the processing chamber at a flow rate between about 100 sccm and about 800 sccm.

26. The method of claim 22, further comprising depositing a photoresist on the oxygen-doped silicon carbide layer.

27. The method of claim 22, further comprising pretreating a substrate with a hydrogen plasma.

* * * * *

UNITED STATES PATENT AND TRADEMARK OFFICE
CERTIFICATE OF CORRECTION

PATENT NO. : 6,838,393 B2
DATED : January 4, 2005
INVENTOR(S) : Kang Sub Yim et al.

It is certified that error appears in the above-identified patent and that said Letters Patent is hereby corrected as shown below:

Column 14,
Line 15, change "an" to -- and --.
Line 18, after "comprising", insert -- a --.
Line 47, change "as" to -- gas --.
Line 52, change "a out" to -- about --.

Column 15,
Line 7, after "comprising", insert -- a --.

Column 16,
Line 13, change "end" to -- and --.

Signed and Sealed this

Twenty-seventh Day of December, 2005

JON W. DUDAS
*Director of the United States Patent and Trademark Office*